United States Patent
Singh et al.

(10) Patent No.: US 6,691,095 B2
(45) Date of Patent: Feb. 10, 2004

(54) METHOD AND SYSTEM TO DETERMINE STATE-OF-HEALTH OF A FUEL CELL USING AN INTELLIGENT SYSTEM

(75) Inventors: Pritpal Singh, Media, PA (US); Craig Fennie, Jr., New Brunswick, NJ (US); David E. Reisner, Bristol, CT (US)

(73) Assignee: U.S. Nanocorp, Farmington, CT (US)

( * ) Notice: Subject to any disclaimer, the term of this patent is extended or adjusted under 35 U.S.C. 154(b) by 0 days.

(21) Appl. No.: 10/122,591

(22) Filed: Apr. 15, 2002

(65) Prior Publication Data

US 2003/0061182 A1 Mar. 27, 2003

Related U.S. Application Data

(63) Continuation-in-part of application No. 09/041,501, filed on Mar. 12, 1998, now Pat. No. 6,456,988.
(60) Provisional application No. 60/051,165, filed on Jun. 27, 1997, and provisional application No. 60/040,476, filed on Mar. 12, 1997.

(51) Int. Cl.$^7$ .................... G06F 15/18; G01R 31/36; H02J 7/00
(52) U.S. Cl. .................... 706/2; 706/900; 706/902; 702/63; 320/130; 320/134
(58) Field of Search .................... 706/2, 900, 902; 702/63; 320/130, 134

(56) References Cited

U.S. PATENT DOCUMENTS

| | | | |
|---|---|---|---|
| 3,720,869 A | 3/1973 | Rowlette | 324/29.5 |
| 3,895,284 A | 7/1975 | Schweizer et al. | 320/48 |
| 3,984,762 A | 10/1976 | Dowgiallo, Jr. | 324/29.5 |
| 4,307,330 A | 12/1981 | Belot | 320/44 |
| 4,433,295 A | 2/1984 | Zaugg | 324/429 |
| 4,595,880 A | 6/1986 | Patil | 324/427 |
| 4,638,237 A | 1/1987 | Fernandez | 320/48 |
| 4,677,363 A | 6/1987 | Kopmann | 320/44 |
| 4,743,855 A | 5/1988 | Randin et al. | 324/430 |
| 4,775,827 A | 10/1988 | Ijntema et al. | 320/44 |
| 4,876,513 A | 10/1989 | Brilmyer et al. | 324/427 |
| 4,947,123 A | 8/1990 | Minezawa | 324/427 |
| 4,958,127 A | 9/1990 | Williams et al. | 324/426 |
| 5,159,272 A | 10/1992 | Rao et al. | 324/429 |
| 5,241,275 A | 8/1993 | Fang | 324/430 |

(List continued on next page.)

FOREIGN PATENT DOCUMENTS

JP 6-242192 9/1994

OTHER PUBLICATIONS

Isidor Buchmann, "Artificial Intelligence Reads Battery State-of-Health in Three Minutes", IEEE The 16th Annual Battery Conference on Applications and Advances, Sep.–Dec. 2001.*

Suntio et al, "Condition Monitoring of Storage Batteries in Telecom Power Systems–Crisp vs. Soft Computing Methodology", IEEE Workshop on SCMIA, Jun. 1999.*

(List continued on next page.)

Primary Examiner—George B. Davis
(74) Attorney, Agent, or Firm—Cantor Colburn LLP

(57) ABSTRACT

A method of and system for determining the state-of-health of a proton exchange membrane fuel cell stack connected to a load comprises detecting the real part of the impedance $Z_1$ of the fuel cell stack at a selected frequency; detecting the voltage $V_1$ of the fuel cell stack at open circuit; detecting the voltage $V_2$ of the fuel cell stack when the maximum load current is being drawn from said fuel cell stack; and determining the state of health of said fuel cell stack from a fuzzy system trained in a relationship between said real part of the impedance of the fuel cell stack at the selected frequency, the voltage of the fuel cell stack at open circuit, and the voltage of the fuel cell stack when the maximum load current is being drawn from said fuel cell stack.

15 Claims, 5 Drawing Sheets

U.S. PATENT DOCUMENTS

| | | | | |
|---|---|---|---|---|
| 5,284,719 | A | | 2/1994 | Landau et al. ................. 429/50 |
| 5,321,627 | A | | 6/1994 | Reher .......................... 364/483 |
| 5,349,540 | A | | 9/1994 | Birkle et al. ................. 364/578 |
| 5,369,364 | A | | 11/1994 | Renirie et al. ............... 324/430 |
| 5,372,898 | A | | 12/1994 | Atwater et al. ............... 429/90 |
| 5,381,096 | A | | 1/1995 | Hirzel ......................... 324/427 |
| 5,404,106 | A | | 4/1995 | Matsuda ..................... 324/431 |
| 5,451,881 | A | | 9/1995 | Finger ........................ 324/433 |
| 5,457,377 | A | | 10/1995 | Jonsson .......................... 320/5 |
| 5,541,489 | A | | 7/1996 | Dunstan ........................ 320/2 |
| 5,587,660 | A | | 12/1996 | Chabbert et al. ........... 324/426 |
| 5,614,829 | A | | 3/1997 | Song ........................... 324/427 |
| 5,631,540 | A | | 5/1997 | Nguyen ....................... 320/30 |
| 5,654,903 | A | | 8/1997 | Reitman et al. ....... 364/551.01 |
| 5,656,919 | A | | 8/1997 | Proctor et al. ................ 320/30 |
| 5,659,240 | A | | 8/1997 | King ............................ 320/30 |
| 5,670,861 | A | | 9/1997 | Nor ............................. 320/15 |
| 5,701,078 | A | | 12/1997 | Lee et al. .................... 324/430 |
| 5,703,464 | A | | 12/1997 | Karunasiri et al. ........... 320/19 |
| 5,705,929 | A | | 1/1998 | Caravello et al. ........... 324/430 |
| 5,825,156 | A | | 10/1998 | Patillon et al. ............... 320/21 |
| 5,936,385 | A | | 8/1999 | Patillon et al. ............. 320/136 |
| 6,011,379 | A | | 1/2000 | Singh et al. ................ 320/132 |
| 6,331,762 | B1 | * | 12/2001 | Bertness ..................... 320/134 |
| 6,392,386 | B2 | * | 5/2002 | Schulmayr et al. ......... 320/132 |
| 6,416,485 | B1 | * | 7/2002 | Rovetta et al. ............. 600/595 |
| 6,566,883 | B1 | * | 5/2003 | Vonderhaar et al. ........ 324/426 |
| 2001/0022509 | A1 | * | 9/2001 | Schulmayr et al. ......... 320/132 |
| 2003/0025481 | A1 | * | 2/2003 | Bertness ..................... 320/155 |

OTHER PUBLICATIONS

Pascoe et al, "Adaptive Fussy Coup De Fouet Based VRLA Battery Capacity Estimation", IEEE International Conference on Systems, Man, and cybernetics, Oct. 2001.*

Spath et al, "The Detection of the State of Health of Lead–Acid Batteries", IEEE, INTELEC, Oct. 1997.*

Ultah, et al., "Fast Intelligent Battery Charging: Neural Fuzzy Approach", IEEE AES Systems Magazine; Jun. 1996.

Cerrulo, et al., "Energy Flows Management In Hybrid Vehicles By Fuzzy Logic Controller", IEEE proceedings of the 7th Mediterranean Electrotechnical Conference; Apr. 1994.

Poulin, et al., "An Expert Management System for URLA Batteries In Remote Telecommunication Centers", IEEE INTELEC, the 16th Inter. Telecommunications Energy Conference; Nov. 1994.

Brady, et al., "A Symbolic Programming Approach To Intelligent Data Reduction"; IEEE Proceedings of the 24th Intersociety Energy Conversion Engineering Conference; Aug. 1989.

S. Sathyanarayana, S. Venugopalan, M.L. Gopikanth, "Impedance parameters and the state–of–charge. I. Nickel–radium battery", Journal of Applied Electrochemistry (1979), pp. 125–139.

S.A.G.R. Karunathilaka, N. A. Hampson, T.P. Haas, W. G. Marshall, R. Leek and T.J. Sinclair, "The impedance of the alkaline zinc–mercuric oxide cell. I. Cell behavior and interpretation of impedance spectra", Journal of Applied Electrochemistry (1981); pp. 573–582.

Naoki, et al., "Estimation of the state of charge Sealed Lead Battery by Neural Networks", Institute of Electronics, Information and Communication Engineers, 1996.

Naoki, et al., "Prediction of the Capacity of Sealed Lead Battery by Neural Networks", Institute Of Electronics, Information and Communication Engineers, 1996.

Final Report for Nickel Cadmium Battery Expert System, Martin Marietta Corporation Airospace Division, 1986.

Jean Alzieu, Hassan Smimite, Christian Glaize, "Improvement of intellligent battery controller: state–of–charge indicator and associated functions", Journal of Power Sources, 1997, pp. 157–161.

William Ross and Peter Budney, "Development of a Battery Runtime Prediction Algorithm and a Method for Determining its Accuracy", IEEE 1995, pp. 277–283.

S.A.G.R. Karunathilaka, R. Leek, N. A. Hampson, M. Hughes and T. J. Sinclair, "A state–of–charge test for the Li–CuO cell", Journal of Applied Electrochemistry (1983), pp. 351–354.

S.A.G.R. Karunathilaka, N.A. Hampson, M. Hughes, W.G. Marshall, R. Leek and T.J. Sinclair, "The prediction of the state–of–charge of some commercial primary cells", Journal of Applied Electrochemistry (1983), pp. 577–586.

Shigenori, et al., "Estimation of Residual Capacity of a Lead Battery using Neural Networks", Denki Gakkai Sangyo Keisoku seigyo Kenkyukai shiryo, 1993.

Tanpo N., "Development of a Battery Checking System using Neural Network", proceedings of the Joint Conference of Hokuriku Chpaters of Institute of Elect. Eng., 1995.

Alex Bykat, "Design of an Expert System for Diagnosis of a Space Borne Battery Based Electric Power System", IEEE, IECEC, proceedings of the 25th Intersociety Energy Conversion Engineering Conference, Aug. 1990.

Taylor, et al., "Standard Smart Batteries for Consumer Applications", IEEE proceedings of the 10th Annual Battery Conference on Applications and Advances, Jan. 1995.

Tanpo, et al., "Estimation of the state–of –charge of Sealed Lead Battery by Neural Neworks", The Institute of Electronics, Information and Communication Engineers, 1996.

Marcus Stoll, "Neural Networks—A Proper Approach to the Energy Management Problem?", Proceedings of the 10th E. C. Phatorotaic Solar Energy Inernational Conference.

Tanpo, et al., "Prediction of the Capacity of Sealed Lead Battery by Neural Network", Conference proceedings of the Institute of Electronics, Information and Communication Engineers, 1996.

Tanpo, et al., "Development of a Battery Checking System Using Neural Network", proceedings of the Joint Conference of Hokuriku Chapters of Institutes of Electrical engineers, 1995.

* cited by examiner

METHOD AND SYSTEM TO DETERMINE STATE-OF-HEALTH OF A FUEL CELL USING AN INTELLIGENT SYSTEM

CROSS REFERENCE TO RELATED APPLICATIONS

This application is a Continuation-In-Part of U.S. patent application Ser. No. 09/041,501, filed Mar. 12, 1998, and now U.S. Pat. No. 6,456,988, which claims the benefit of U.S. provisional patent application Ser. No. 60/040,476, flied Mar. 12, 1997 and claims the benefit of U.S. provisional patent application Ser. No. 60/051,165, filed Jun. 27, 1997.

This invention was made with Government support under contract USZA22-97-P-0010 awarded by the U.S. Department of Defense, and DASG60-00-M-0097 awarded by the U.S. Army. The Government has certain rights in the invention.

BACKGROUND

The present invention relates to determining the state-of-health (SOH) of an electrochemical device. More particularly, the present invention relates to determining the SOH of a proton exchange membrane fuel cell using an intelligent system, e.g. a fuzzy logic system.

The SOH of a battery, fuel cell, or other electrochemical device has been interpreted in different ways by scientists/engineers in the field. Most research in this area has focused on electrochemical batteries. In the case of valve regulated lead acid (VRLA) batteries used by utility companies for providing emergency backup power, SOH is interpreted to mean that a battery is close to the end of its cycle life and needs replacement. Several papers including Feder and Hlavac 1994 INTELEC Conf. Proc. pp. 282–291 (1994) and Hawkins and Hand 1996 INTELEC Conf. Proc. pp. 640–645 (1996) demonstrate that the increase in impedance of aging VRLA batteries can be used to indicate the SOH of the battery.

Another interpretation of battery SOH is the capability of a battery to meet its load demand. This is also referred to as "battery condition" by others in the field. To obtain the SOH of a battery in the terms defined, both the available charge capacity of the battery and the maximum power available from the battery are required. Several approaches have been used to determine the condition of a battery. In U.S. Pat. No. 5,365,453 is described a method in which a ratio of a change in battery voltage to a change in load is used to predict impending battery failure in battery powered electronic devices. Similar methods in which the battery response to and recovery from the application of a load is used to determine the SOH of batteries are reported in U.S. Pat. Nos. 4,080,560 and 5,159,272. While these load profiling approaches work reasonably well for batteries integrated into a system, they are not necessarily accurate or reliable ways of determining the SOH of batteries outside a system.

SUMMARY

The above-discussed and other drawbacks and deficiencies of the prior art are overcome or alleviated by a method of and system for determining the state-of-health of a proton exchange membrane (PEM) fuel cell stack connected to a load, comprising: detecting the real part of the impedance $Z_1$ of the fuel cell stack at a selected frequency; detecting the voltage $V_1$ of the PEM fuel cell stack at open circuit; detecting the voltage $V_2$ of the PEM fuel cell stack when the maximum load current is being drawn from said PEM fuel cell stack; and determining the state of health of said PEM fuel cell stack from a fuzzy system trained in a relationship between said real part of the impedance of the fuel cell stack at the selected frequency, the voltage of the PEM fuel cell stack at open circuit, and the voltage of the PEM fuel cell stack when the maximum load current is being drawn from said PEM fuel cell stack.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DETAILED DESCRIPTION

The present continuation in part of SOH patent filing is focused on applying the fuzzy system approach to determining the SOH of proton exchange membrane (PEM) fuel cell stacks.

Figure 1:
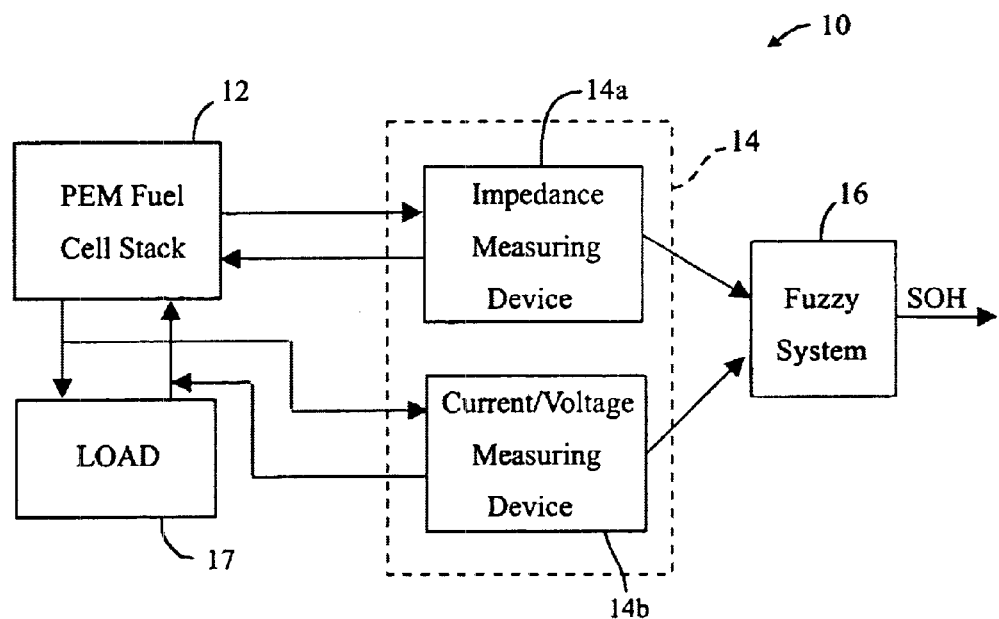
FIG. 1 is a block diagram of method for determining state-of-health of a PEM fuel cell stack in accordance with the present invention.

Referring to FIG. 1, a system for determining the State-of-Health (SOH) in accordance with present invention is generally shown at 10. System 10 comprises a fuel cell stack 12, a load 17, an impedance measuring device 14a, a current/voltage measuring device 14b, and a fuzzy system 16. The fuel cell stack 12 comprises a proton exchange membrane (PEM) fuel cell stack. Fuzzy system 16 is trained in the relationship between impedance (e.g., from impedance measuring device 14a) and current-voltage characteristics of the fuel cell stack 12 (e.g., from current/voltage measuring device 14b), and the SOH of fuel cell 12. The impedance measurements and current/voltage characteristics are obtained by device 14 and provided to fuzzy system 16 as inputs, with the SOH being the output of fuzzy system 16.

The state-of-health of a fuel cell 12 is defined as the device's ability to perform a specified task. Phenomena such as moisture in the fuel cell stack's air channels and dry out of the proton exchange membrane result in a diminished ability of the fuel cell to provide power to a load. These particular phenomena, however, are recoverable failure modes of the fuel cell stack and appropriate measures can be taken to reverse their effects. Blowing out the moisture from the air channels of the fuel cell allows the power output delivery capability of the fuel cell to be recovered. Also, running the fuel cell under load rehumidifies a dried-out membrane allowing it to deliver its full power capability to a load.

Figure 2:
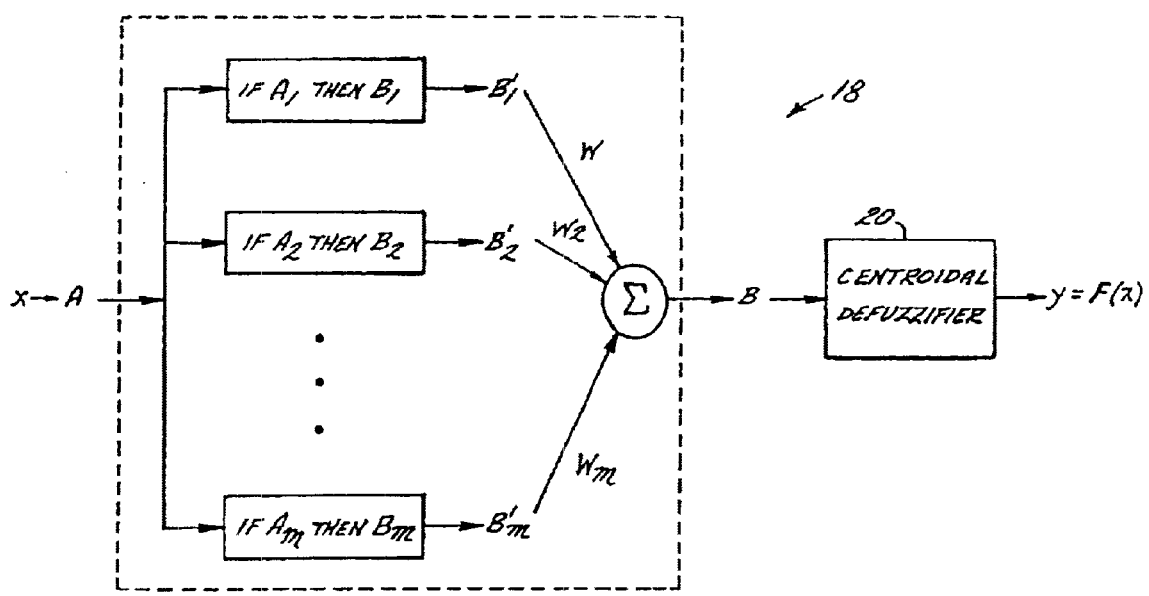
FIG. 2 is a block diagram of an additive fuzzy system for use in the present invention.

Referring to FIG. 2, a preferred embodiment of the fuzzy system comprises an additive fuzzy system 18 with centroid defuzzification 20. Additive fuzzy system 18 stores m fuzzy rules of the form, "if X is $A_j$ then Y is $B_j$", and computes the output F(x) as the centroid of the summed and partially fired then-part fuzzy sets $B'_j$, see Fuzzy Engineering by Bart Kosko, Prentice Hall, 1997. Equation 1 mathematically expresses additive fuzzy system 18 as:

$$F(x) = \frac{\sum_{j=1}^{m} w_j a_j(x) V_j c_j}{\sum_{j=1}^{m} w_j a_j(x) V_j}$$ EQUATION 1

$$a_j(x) = \prod_{i=1}^{n} a_j^i(x_i)$$ EQUATION 2

$$B = \sum_{j=1}^{m} w_j B'_j = \sum_{j=1}^{m} w_j a_j(x) B_j$$ EQUATION 3 where:
$w_j$ is a weight of rule j,
$a_j^i$ represents if-part set function (membership function of input i of rule j on input i),
$a_j$ represents joint if-part set function (result of "$a_j^1$ 'and' $a_j^2$ ... 'and' $a_j^i$") that states the degree to which the input x belongs to the if-part fuzzy set $a_j$,
$B_j$ represents then-part set function (membership function j on the output),
$V_j$ is the finite positive volume (or area) of the then-part set $B_j$,
$c_j$ is the centroid of the then-part set $B_j$,
$B'_j$ is the scaled then-part set (scaled output membership function j, result of $a_j(x)B_j$), and
B is the output set prior to defuzzification, In linguistic terms, additive fuzzy system 18 can be described in terms of a set of if-then rules:
RULE 1: If $X_1$ is $a^1_1$ and $X_2$ is $a^2_1$ ... and $X_n$ is $a^n_1$, then F(X) is $B_1$,
RULE 2: If $X_1$ is $a^1_2$ and $X_2$ is $a^2_2$ ... and $X_n$ is $a^n_2$, then F(X) is $B_2$,
RULE m: If $X_1$ is $a^1_m$ and $X_2$ is $a^2_m$ ... and $X_n$ is $a^n_m$, then F(X) is $B_m$,
where m is the number of rules and n is the number of inputs.

The linguistic description and the mathematical description of additive fuzzy system 18 are equivalent. They are merely different views of the same fuzzy system. Both approaches map a given input X to a given output F(X) by a process known as fuzzy inference. The following example demonstrates the fuzzy inference process. First, fuzzify the inputs by taking the inputs and determine the degree to which they belong to each of the appropriate input fuzzy sets via membership functions. Mathematically expressed as: "$a_1^1(X_1), a_1^2(X_2) \ldots a_1^m(X_m)$". Linguistically expressed as: "If $X_1 = a_1^1$, If $X_2 = a_1^2$, ..., If $X_m = a_1^m$". Second, apply a fuzzy operator by combining if-part sets of a given rule to obtain one number that represents the result of the antecedent for that rule. Mathematically expressed as EQUATION 2 hereinabove. Linguistically expresses as: "$a_1^1$ 'and' $a_1^2$ 'and' $a_1^m$" where 'and' is the T-norm product. Third, apply an implication method by shaping the consequent (or output fuzzy set) based on the result of the antecedent for that rule. Mathematically expressed as: "$B_1 = a_1(X)B_1$". Linguistically expressed as: "If $a_1(X)$, then $B_1$". Fourth, aggregate all outputs by combining the consequent of each rule to form one output fuzzy set. Mathematically expressed as EQUATION 3 hereinabove. Fifth, defuzzify by mapping the output fuzzy set to a crisp number. Mathematically expressed as "F(x)=centroid(B)=EQUATION 1". In general, see Fuzzy Logic Toolbox, for use with MATLAB, The Mathworks, Inc. by Jang and Gulley, incorporated herein by reference.

By way of example, a supervised gradient descent can learn or tune additive fuzzy system 18 given by EQUATION 1 by changing the rule weights $w_j$, the then-part volumes $V_j$, the then-part centroids $c_j$, or the if-part set functions $a_j$.

Figure 3A:
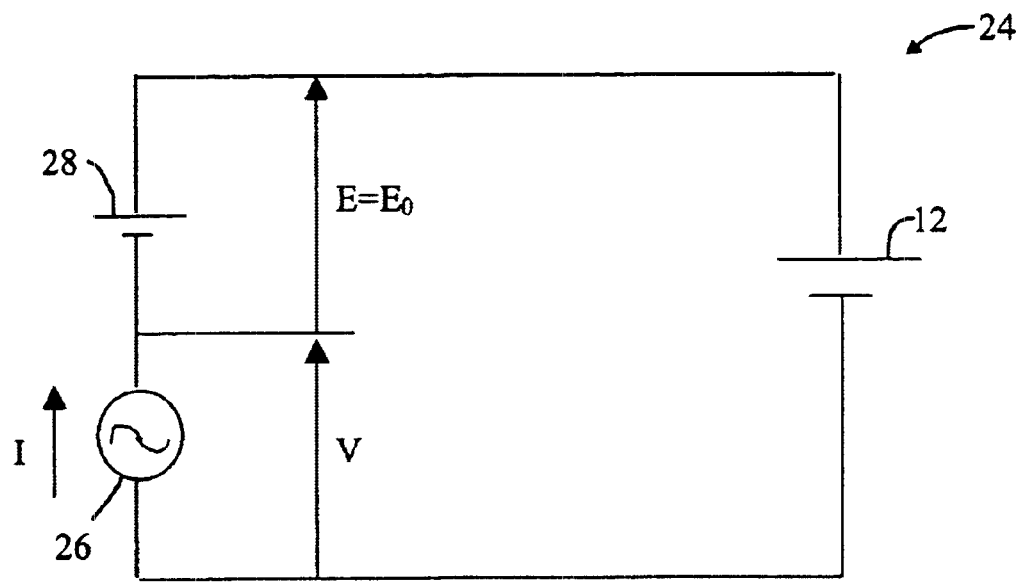
FIG. 3A is a schematic diagram of a circuit to measure battery impedance.

Referring to FIG. 3A, a circuit 24 for measuring fuel cell impedance is shown. Circuit 24 comprises fuel cell 12 whose impedance is to be measured, an a.c. current generator 26 of variable frequency, and a d.c. variable voltage generator 28. Fuel cell 12 and generators 26 and 28 are connected in series in any order but in such a way that fuel cell 12 and d.c. generator 28 have in common poles of the same sign, in this example positive poles. The no-load voltage of fuel cell 12 is designated as $E_0$, the effective current of a.c. generator 26 is designated as I and the voltage of d.c. generator 28 is designated as E. Voltage E is chosen so as to be equal to $E_0$ to prevent fuel cell 12 issuing a direct current. In this way, the current flowing in the loop made up of fuel cell 12 and generators 26 and 28 has no direct component and its alternating component designated I determines the voltage drop V across the fuel cell 12. Variables V and I are complex numbers and their ratio V/I=Z=Z'+jZ" defines the internal complex impedance of fuel cell 12. This impedance has a real or resistive part Z' and an imaginary or reactive part Z". The magnitude of this impedance, |Z|, is given by $|Z|=(Z'^2+Z''^2)^{1/2}$. The fuel cell impedance is a function of the frequency f of the a.c. current.

Figure 3B:
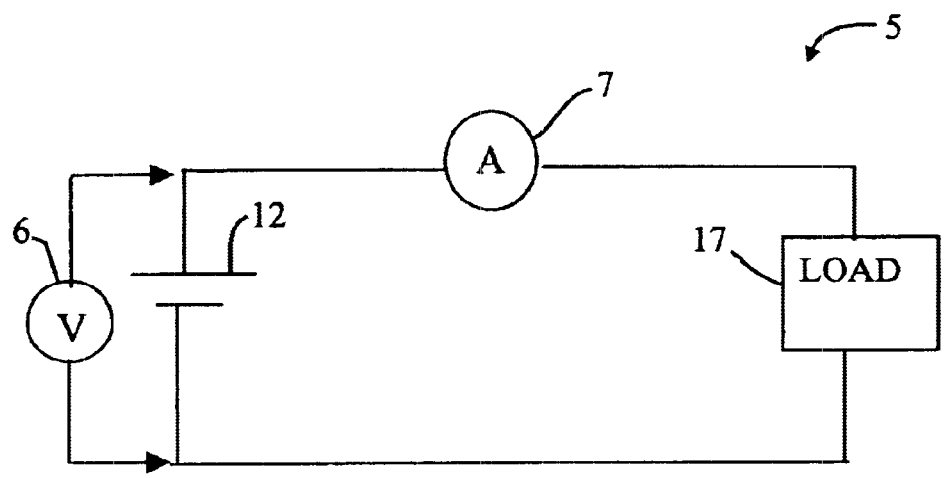
FIG. 3B is a schematic diagram of a circuit to measure the current and voltage delivered by the PEM fuel cell stack to the load.

Referring to FIG. 3B, a circuit 5 for measuring current-voltage characteristics of a fuel cell stack is shown. A voltmeter 6 is placed across the terminals of a PEM fuel cell stack 12 such that the positive lead of the voltmeter is connected to the positive terminal of said PEM fuel cell stack and the negative lead of the voltmeter is connected to the negative terminal of said PEM fuel cell stack. An ammeter 7 is used to measure the current from said PEM fuel cell stack to the load 17. The ammeter 7 is connected in series between said PEM fuel cell stack 12 and the load 17 such that the current must flow from PEM fuel cell stack 12 through the ammeter 7 to pass into the load.

Figure 4:
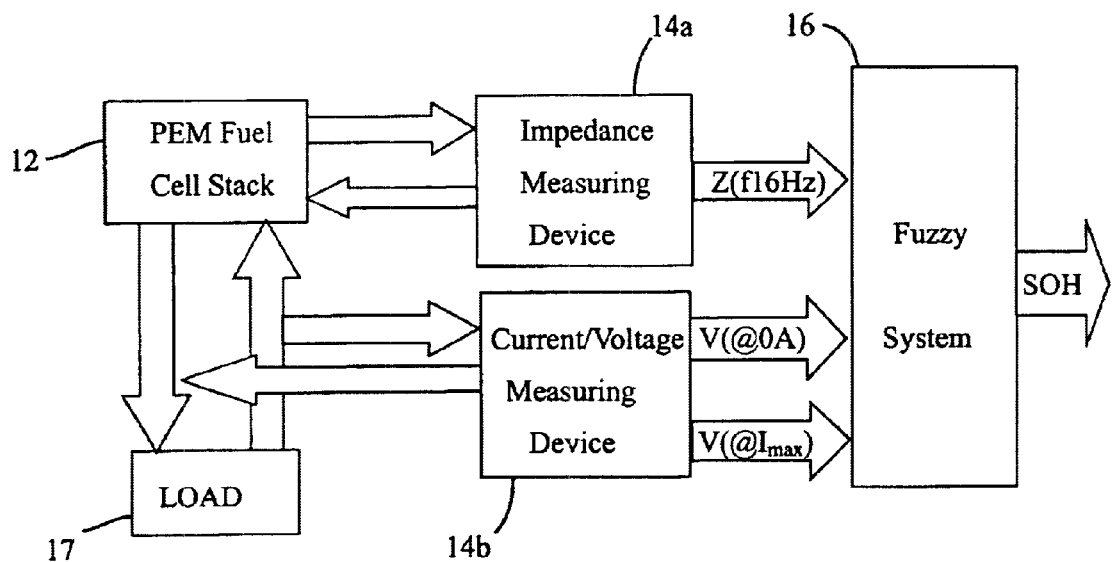
FIG. 4 is a block diagram of a fuzzy system for use in determining the state of health in the present invention.

Referring now to FIG. 4, fuzzy system 16 is trained in the relationship between the electrical characteristics of the fuel cell and the SOH of the fuel cell. Specifically, the fuzzy system learns the underlying function F that relates the real part of the impedance at a selected frequency, e.g., between about 2 Hz to about 25 Hz; preferably, between about 5 Hz and about 20 Hz; and more preferably about 16 Hz (e.g., Z' at 16 Hz), the difference between the fuel cell stack voltage at open circuit and the fuel cell stack voltage at maximum load current, and the sum of the fuel cell stack voltage at open circuit and the fuel cell stack voltage at maximum load current, and the SOH of the fuel cell.

Thus, while specific selected frequencies for measuring impedance and specific selected impedance characteristics (e.g., real part, imaginary part, magnitude, and phase angle) are listed herein and known to be effective, it understood that certain impedance characteristics at other various frequencies and/or fewer or more different frequencies may also be effective in obtaining a valid result. Furthermore, the optimal frequency for measuring impedance may vary from one fuel cell to another, and can be determined empirically by mapping impedance characteristics of a fuel cell in various conditions over a range of frequencies and selecting the frequency or frequencies at which an impedance characteristic varies the most between the extreme conditions.

Figure 5:
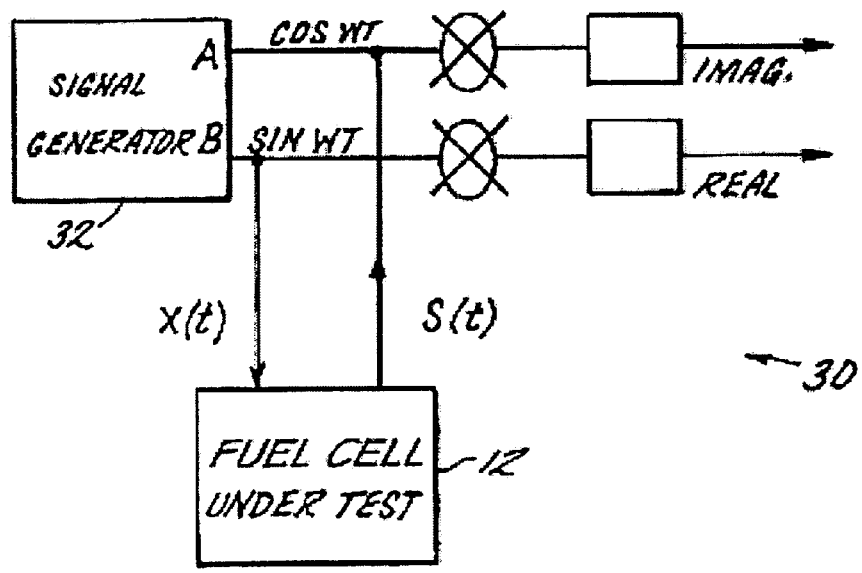
FIG. 5 is a circuit block diagram for determining fuel cell impedance in accordance with the present invention.

Referring to FIG. 5, a circuit 30 for measuring impedance of PEM fuel cell stack 12 at a single frequency is generally shown. Circuit 30 comprises PEM fuel cell stack 12 whose impedance is to be measured and an a.c. signal generator 32. A small amplitude, perturbing sinusoidal signal, $x(t)=X_0 \sin(\omega t)$, is applied to PEM fuel cell stack 12. The response of the PEM fuel cell stack 12 to this perturbing signal is $S(t)=X_0 K(\omega)\sin(\omega[t+\phi(\omega)])$ and is correlated with two reference signals, one in phase with $x(t)$ and the other 90° out of phase with $x(t)$, i.e. $\sin(\omega t)$ and $\cos(\omega t)$, in order to calculate:

$$\Re = \frac{1}{T}\int_0^T S(t)\sin\omega t\, dt \qquad \text{EQUATION 4}$$

$$\Im = \frac{1}{T}\int_0^T S(t)\cos\omega t\, dt \qquad \text{EQUATION 5}$$

This allows the elimination of higher order harmonics than the fundamental and with an appropriate selection of frequency window and multiple measurements, noise rejection can be very high. In the limit as:

$T \to \infty$, $\Re \to K(\omega)\cos\phi(\omega)$, $\Im \to K(\omega)\sin\phi(\omega)$, where $K(\omega)$ represents the amplitude of the impedance at a frequency $\omega/2\pi$ and $\phi(\omega)$ represents the phase of the impedance at frequency $\omega/2\pi$. Circuit 30 allows the determination of the impedance at different frequencies and may be set up to measure the impedance at the single frequency of interest. Instruments that can be used to perform the impedance measurements are commercially available. For example, the Solartron 1260 Impedance/Gain-Phase Analyzer available from Solartron, Inc., Houston, Tex. is suitable for this purpose.

Figure 6:
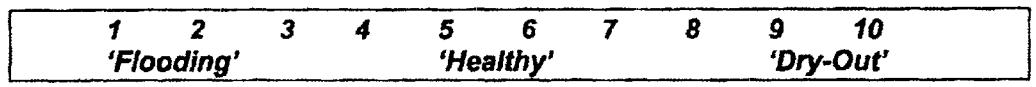
FIG. 6 is a qualitative scale for indicating the state of health of the PEM fuel cell stack.

Referring to FIG. 6 a scale indicating the SOH of the fuel cell is indicated. On this scale a healthy fuel cell is designated by a 5 or 6, a fuel cell with progressively higher degrees of membrane dry out are designated by higher numbers (7–10) with a larger number corresponding to an increased amount of membrane dry out, and smaller numbers (1–4) corresponding to progressively more moisture in the air channels the lower number indicating a larger moisture content of the air channels.

Figure 7:
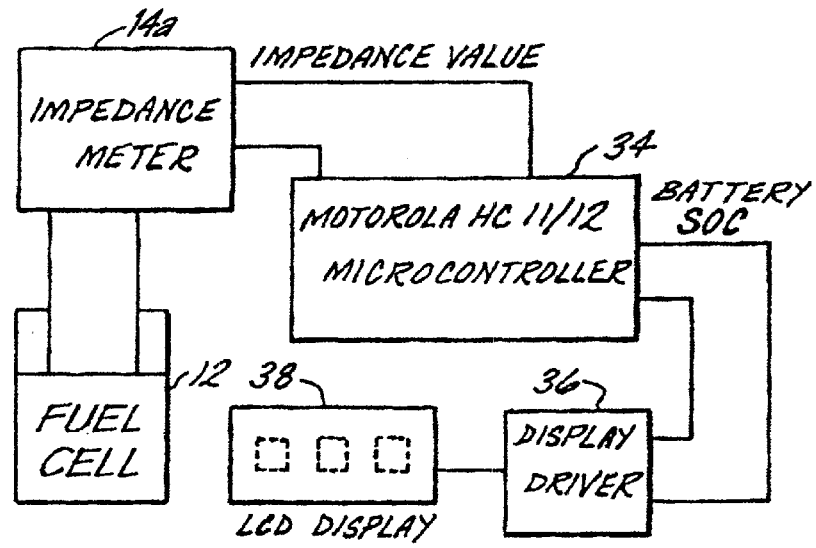
FIG. 7 is a circuit block diagram for determining state of health of the PEM fuel cell stack in accordance with present invention.

To determine fuel cell SOH once the impedance is known and the PEM fuel cell stack voltage at open-circuit and the PEM fuel cell stack voltage at maximum load current are known, a circuit 34 (FIG. 7) may be used. The impedance value at the single frequency from circuit 30 and the open-circuit fuel cell stack voltage and the fuel cell stack voltage at maximum load current from circuit 31 (refer to FIG. 4) are fed into a microcontroller 34 (e.g. Motorola MC 68HC11/12) either as analog or digital signals, analog signals would be fed into the A/D converters on microcontroller 34 where they would be converted to digital signals. The impedance at the selected frequency, $Z_1$, is stored in a first memory location and the fuel cell stack voltage at open-circuit voltage, $V_1$, is stored in a second memory location, and the fuel cell stack voltage at maximum load current, $V_2$, stored at a third memory location. The sum of $V_1$ and $V_2$ is then calculated in microcontroller 34 and the result stored in a fourth memory location. The difference of $V_1$ and $V_2$ is then calculated in microcontroller 34 and the result stored in a fifth memory location. The three variables stored in the first, fourth and fifth memory locations serve as the input variables to the fuzzy system to determine the SOH of the fuel cell 12. The output of this fuzzy system, the SOH of fuel cell 12, is stored in a sixth memory location. The fuel cell SOH is then output to a display driver 36 and interfaced to a liquid crystal display 38.

Figure 8A:
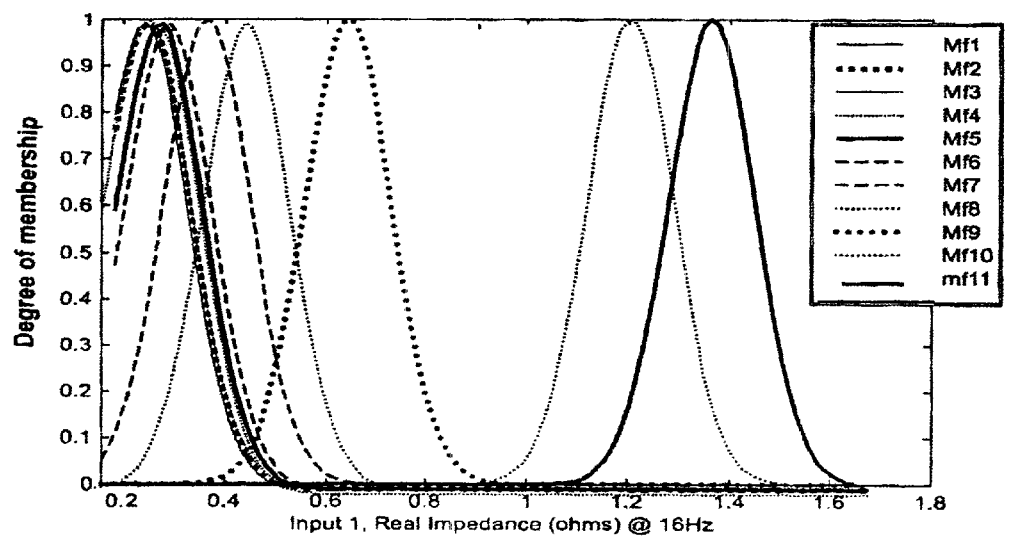
FIGS. 8A, 8B and 8C are membership functions for the three input variables used in the fuzzy system to determine state of health of PEM fuel cell stack in accordance with present invention.
Figure 8B:
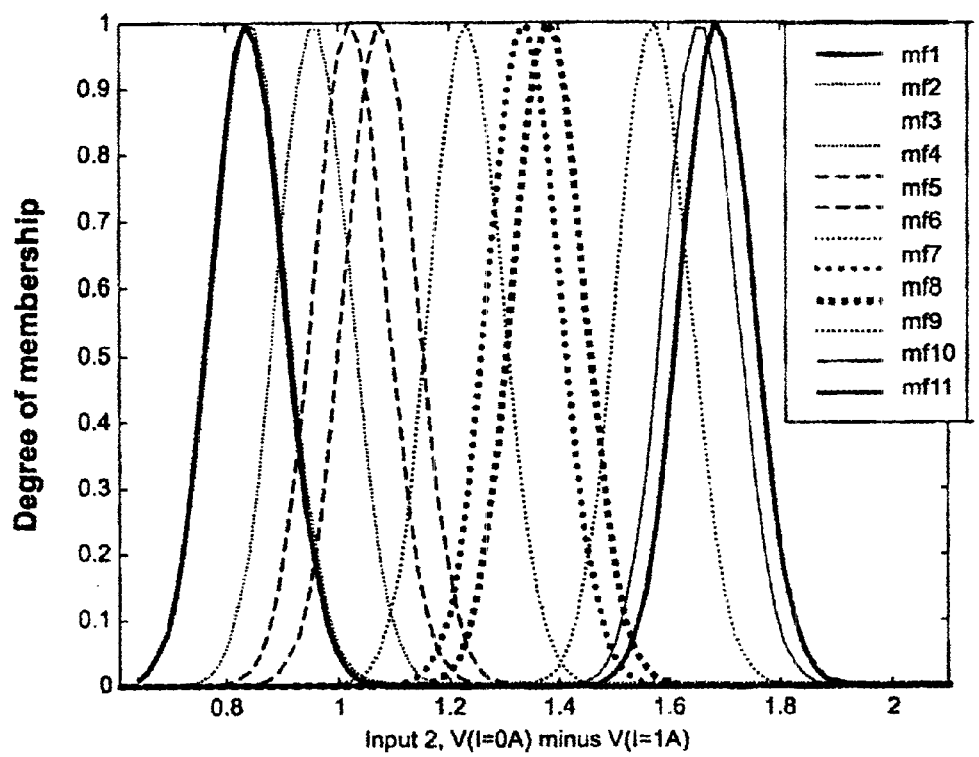
Figure 8C:
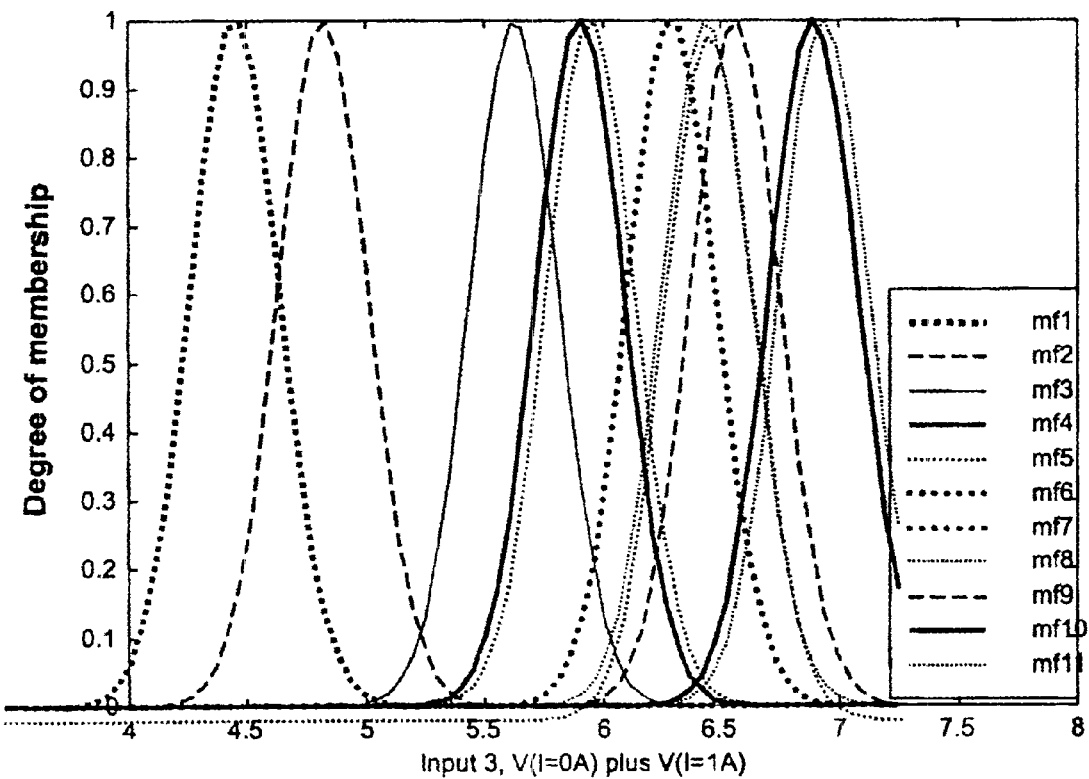

In one embodiment of this method, a fuzzy system implementation for determining the SOH of a 5W H Power PowerPEM™ fuel cell stack in which fuel cell failure of both the membrane dry out and flooding of the air channels and recovery therefrom is described. The membership functions for the three input variables, the real part of the impedance at 16 Hz, the sum of the open-circuit output voltage of the PEM fuel cell stack and the output voltage at maximum load current, and the difference of the open-circuit output voltage of the PEM fuel cell stack and the output voltage at maximum load current for fuzzy system 16 used to determine the SOH of said 5W H Power PowerPEM™ fuel cell stack is shown in FIGS. 8A, 8B, and 8C respectively. The rule set for fuzzy system 16 used to determine the SOH of said 5W H Power PowerPEM™ fuel cell stack is shown in TABLE 1.

TABLE 1

Fuzzy Logic Model I - Failure Mode Prediction Rules.
H Power PowerPEM ™ 5 W (4-cell stacks) fuel cell.

If (in1 is in1mf1) and (in2 is in2mf1) and (in3 is in3mf1) then (Healthy)
If (in1 is in1mf2) and (in2 is in2mf2) and (in3 is in3mf2) then (Failure is Dry Out)
If (in1 is in1mf3) and (in2 is in2mf3) and (in3 is in3mf3) then (Healthy)
If (in1 is in1mf4) and (in2 is in2mf4) and (in3 is in3mf4) then (Failure is Dry Out)
If (in1 is in1mf5) and (in2 is in2mf5) and (in3 is in3mf5) then (Failure is Dry Out)
If (in1 is in1mf6) and (in2 is in2mf1) and (in3 is in3mf1) then (Failure is Flooding)
If (in1 is in1mf7) and (in2 is in2mf2) and (in3 is in3mf2) then (Failure is Flooding)
If (in1 is in1mf8) and (in2 is in2mf3) and (in3 is in3mf3) then (Failure is Flooding)
If (in1 is in1mf9) and (in2 is in2mf4) and (in3 is in3mf4) then (Failure is Flooding)
If (in1 is in1mf10) and (in2 is in2mf5) and (in3 is in3mf5) then (Failure is Dry Out)
If (in1 is in1mf10) and (in2 is in2mf5) and (in3 is in3mf5) then (Failure is Dry Out)

where input1 is real part of impedance @ 16 Hz
input2 is Voltage @ I = 0A − Voltage @ I = 1A
input3 is Voltage @ I = 0A + Voltage @ I = 1A While preferred embodiments have been shown and described, various modifications and substitutions may be made thereto without departing from the spirit and scope of the invention. Terms such as "first" and "second" as used herein are not intended to imply an order of importance or location, but merely to distinguish between one element and another of like kind. It is to be understood that the invention has been described by way of illustration only, and such illustrations and embodiments as have been disclosed herein are not to be construed as limiting to the claims.

What is claimed is:

1. A method of determining a state-of-health of a fuel cell stack connected to a load, comprising:

detecting an impedance characteristic $Z_1$ of the fuel cell stack at a selected frequency;

detecting a voltage $V_1$ of the fuel cell stack at open circuit;

detecting a voltage $V_2$ of the fuel cell stack when the maximum load current is being drawn from said fuel cell stack; and determining said state-of-health of said fuel cell stack from a fuzzy system trained in a relationship between said impedance characteristic $Z_1$, said voltage $V_1$ of the fuel cell stack at open circuit, and said voltage $V_2$ of the fuel cell stack when a maximum load current is being drawn from said fuel cell stack.

2. The method of claim 1 wherein said detecting an impedance characteristic $Z_1$ comprises detecting a real part of an impedance at said selected frequency, the selected frequency being between about 2 Hz and about 25 Hz.

3. The method of claim 2 wherein said selected frequency is between about 5 Hz and about 20 Hz.

4. The method of claim 2 wherein said selected frequency is about 16 Hz.

5. The method of said claim 1 wherein said step of determining said state-of-health is performed using a microcontroller.

6. The method of claim 1 further comprising determining a failure mode of the fuel cell stack using said fuzzy system.

7. The method of claim 6 wherein said determining said failure mode includes discriminating between a dry-out and a flooded condition of a fuel cell stack.

8. A system for detecting a state-of-health of a fuel cell stack comprising:

a microcontroller adapted to receive inputs from an impedance measurement device and a voltage measurement device, the microcontroller including software causing the microcontroller to:

store an impedance value corresponding to an impedance characteristic of the fuel cell stack at a selected frequency, a first voltage value of the fuel cell stack when a circuit including the fuel cell stack is open, and a second voltage value of the fuel cell stack when the fuel cell stack is under a maximum load;

calculate a sum of the first and second voltage values;

calculate a difference of the first and second voltage values;

input the impedance value and the sum and the difference of the first and second voltage values into a fuzzy system trained in a relation of the impedance value and the sum and the difference of the first and second voltage values and the state-of-health of the fuel cell stack; and store the state of health of the fuel cell stack output from the fuzzy system.

9. The system of claim 8 wherein said fuzzy system is implemented by said microcontroller.

10. The system of claim 8 wherein said impedance characteristic is a real part of impedance and said selected frequency is between about 2 Hz and about 25 Hz.

11. The system of claim 10 wherein said selected frequency is between about 5 Hz and about 20 Hz.

12. The system of claim 10 wherein said selected frequency is about 16 Hz.

13. The system of claim 10 wherein said fuel cell stack is a proton exchange membrane fuel cell stack.

14. The system of claim 8 wherein said fuzzy system is trained to determine a failure mode of the fuel cell stack.

15. The system of claim 14 wherein said determine a failure mode includes discriminating between a dry-out and a flooded condition of said fuel cell stack.

* * * * *